US009932662B2

(12) United States Patent
Lee

(10) Patent No.: US 9,932,662 B2
(45) Date of Patent: Apr. 3, 2018

(54) MASK FRAME ASSEMBLY, METHOD OF MANUFACTURING THE SAME AND METHOD OF MANUFACTURING DISPLAY DEVICE BY USING THE SAME

(71) Applicant: SAMSUNG DISPLAY CO., LTD., Yongin-si, Gyeonggi-do (KR)

(72) Inventor: Sangshin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/960,281

(22) Filed: Dec. 4, 2015

(65) Prior Publication Data

US 2016/0260935 A1 Sep. 8, 2016

(30) Foreign Application Priority Data

Mar. 3, 2015 (KR) .................. 10-2015-0029853

(51) Int. Cl.
*H01L 51/40* (2006.01)
*C23C 14/04* (2006.01)
*H01L 51/00* (2006.01)

(52) U.S. Cl.
CPC ........ *C23C 14/042* (2013.01); *H01L 51/0011* (2013.01)

(58) Field of Classification Search
None
See application file for complete search history.

(56) References Cited

U.S. PATENT DOCUMENTS

| 2010/0224125 A1 | 9/2010 | Lee et al. |
| 2010/0267227 A1* | 10/2010 | Ko .................. C23C 14/042 438/597 |
| 2012/0174862 A1 | 7/2012 | Lee |
| 2014/0230219 A1* | 8/2014 | Lee .................. C23C 14/042 29/428 |

FOREIGN PATENT DOCUMENTS

| JP | 2005-339858 A | 12/2005 |
| KR | 10-2006-0114602 A | 11/2006 |
| KR | 10-2007-0064906 A | 6/2007 |
| KR | 10-2010-0099620 A | 9/2010 |
| KR | 10-2012-0081512 A | 7/2012 |

* cited by examiner

*Primary Examiner* — Calvin Choi
(74) *Attorney, Agent, or Firm* — Lewis Roca Rothgerber Christie LLP

(57) ABSTRACT

A mask frame assembly includes a mask having pattern openings and a frame including a first support portion configured to support an end of the mask and having a clamping slot and a support slot adjacent to the clamping slot; and a second support portion connected to the first support portion.

10 Claims, 7 Drawing Sheets

MASK FRAME ASSEMBLY, METHOD OF MANUFACTURING THE SAME AND METHOD OF MANUFACTURING DISPLAY DEVICE BY USING THE SAME

RELATED APPLICATION

This application claims priority to and the benefit of Korean Patent Application No. 10-2015-0029853, filed on Mar. 3, 2015 in the Korean Intellectual Property Office, the disclosure of which is incorporated herein in its entirety by reference.

BACKGROUND

1. Field

One or more exemplary embodiments of the present invention relate to a mask frame assembly, a method of manufacturing the same, and a method of manufacturing a display device by using the same.

2. Description of the Related Art

Mobile electronic devices have recently been popularly used. Mobile electronic devices, such as tablet personal computers (PCs), have recently become widely used as well as miniaturized electronic devices, such as mobile phones.

Such mobile electronic devices include a display unit to provide (e.g., display) visual information, such as images or videos, to users. Recently, along with the miniaturization of other components for driving the display unit, a portion of an electronic device occupied by the display unit has been gradually increasing. In addition, display units having a bendable structure (e.g., a structure that is capable of being bent to a predetermined angle from a planar state) have also been developed.

To form the display unit described above, layers of the display unit may be formed by using various methods, such as a deposition method and/or a photo masking process.

In a process of performing the deposition by vaporizing and depositing (e.g., spraying) a deposition material, among the deposition methods in general, a deposition source may be arranged at the bottom of a deposition device and a mask may be arranged on (or over) the deposition source. In addition, a substrate may be arranged on the mask so that the deposition material passing through the mask may be deposited on the substrate.

In this case, a gap between the mask and the substrate may affect the precision of a pattern of the deposition material deposited on the substrate. The pattern of the deposition material is important for a resolution and performance of the display unit and may affect the quality of a product. Therefore, various apparatuses and methods have been developed to increase the precision of the deposition material pattern.

Information disclosed in this Background section may have been already known to the inventors before achieving the inventive concept or may be technical information acquired in the process of achieving the inventive concept. Therefore, it may contain information that does not form known technology.

SUMMARY

One or more exemplary embodiments of the present invention include a mask frame assembly for thin layer deposition, a method of manufacturing the same, and a method of manufacturing a display device by using the same.

One or more exemplary embodiments of the present invention include a mask frame assembly including: a mask having pattern openings; and a frame including: a first support portion having a clamping slot and a support slot, the support slot being adjacent to the clamping slot; and a second support portion connected to the first support portion.

According to one or more exemplary embodiments, the mask may include a first welding opening extending through an end of the mask.

According to one or more exemplary embodiments, the mask frame assembly may further include a first welding portion at the first welding opening and connecting the mask and the first support portion to each other.

According to one or more exemplary embodiments, the clamping slot may extend through the first support portion.

According to one or more exemplary embodiments, the clamping slot may have a depth that is less than a thickness of the first support portion.

According to one or more exemplary embodiments, the support slot may extend along a second direction.

According to one or more exemplary embodiments, the mask frame assembly may further include a support stick extending along a second direction, accommodated in the support slot, and being over the clamping slot.

According to one or more exemplary embodiments, the support stick may include a second welding opening extending through an end of the support stick.

According to one or more exemplary embodiments, the mask frame assembly may further include a second welding portion at the second welding opening and joining the support stick to at least one of the first support portion and the second support portion.

According to one or more exemplary embodiments, the first support portion may further include a cutting slot arranged nearer to a center of the frame assembly than the support slot is.

According to one or more exemplary embodiments, the mask may be nearer to a center of the frame assembly than an outer end of the cutting slot is.

According to another exemplary embodiments of the present invention, a manufacturing method of a mask frame assembly includes: arranging a mask on a frame, the mask having pattern openings and the frame including: a first support portion configured to support an end of the mask and having a clamping slot and a support slot, the clamping slot being configured to allow in and out movement of a clamper, and the support slot being adjacent to the clamping slot; and a second support portion connected to the first support portion; mounting a support stick on the support slot and over the clamping slot, the support stick extending along a second direction; stretching an end of the mask in a first direction crossing the second direction and aligning a portion of the end of the mask to be on the support stick; joining the mask and the frame to each other; and removing a cutting portion of the mask.

According to one or more exemplary embodiments, the method may further include preparing the mask by forming a first welding opening extending through an end of the mask.

According to one or more exemplary embodiments, the joining the mask and the frame may include forming a first welding portion at the first welding opening to join the mask and the frame to each other.

According to one or more exemplary embodiments, the clamping slot may have a depth that is less than a thickness of the first support portion.

According to one or more exemplary embodiments, the clamping slot may extend through the first support portion.

According to one or more exemplary embodiments, the support slot may extend along the second direction.

According to one or more exemplary embodiments, the mounting the support stick on the support slot may include forming a second welding opening that extends through an end of the support stick and forming a second welding portion at the second welding opening to join the support stick and the frame to each other.

According to one or more exemplary embodiments, the method may further include preparing the mask, the preparing the mask including forming a cutting slot on the first support portion, the cutting slot being arranged nearer to a center of the mask frame assembly than the support slot is, having a depth that is less than a thickness of the first support portion, and both the ends of the mask being arranged nearer to the center of the mask frame assembly than an outside surface of the cutting slot after the cutting portion of the mask is removed.

According to another exemplary embodiment, a manufacturing method of a display device is presented, the display device including a first electrode and a second electrode oppositely facing each other on a substrate and an organic layer between the first electrode and the second electrode, wherein the organic layer and the second electrode are deposited on the substrate by using a mask frame assembly, the mask frame assembly including: a mask having pattern openings; and a frame, the frame including: a first support portion configured to support an end of the mask and having a clamping slot and a support slot adjacent to the clamping slot; and a second support portion connected to the first support portion.

BRIEF DESCRIPTION OF THE DRAWINGS

These and/or other aspects of the present invention will become apparent and more readily appreciated from the following description of exemplary embodiments thereof, taken in conjunction with the accompanying drawings, in which.

DETAILED DESCRIPTION

Figure 1:
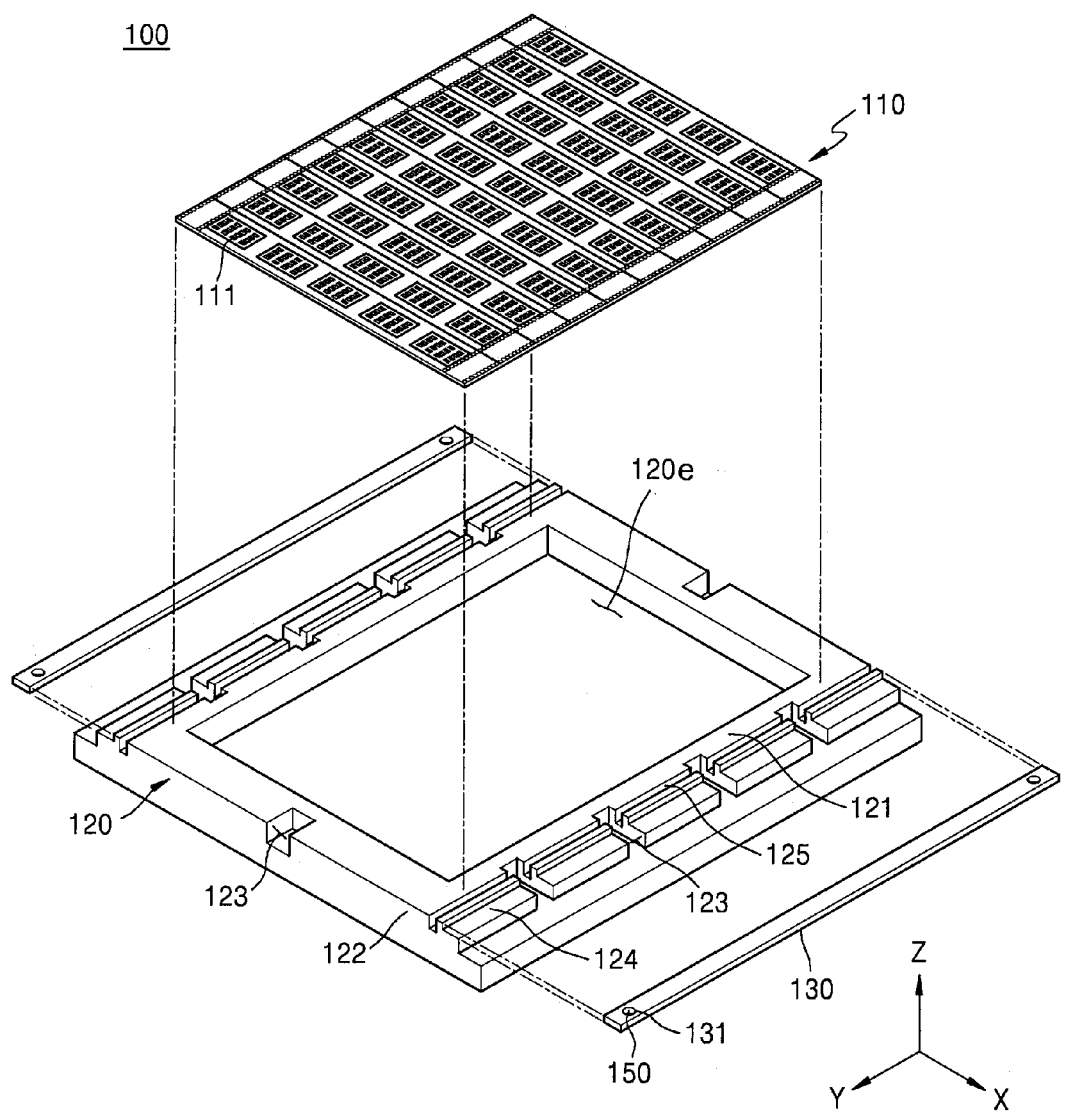
FIG. 1 is an exploded perspective view schematically illustrating a mask frame assembly according to an embodiment of the present invention.

Reference will now be made in detail to exemplary embodiments, examples of which are illustrated in the accompanying drawings, wherein like reference numerals refer to like elements throughout. The exemplary embodiments may have different forms and should not be construed as being limited to the descriptions set forth herein. Accordingly, the exemplary embodiments described herein are merely described below, by referring to the figures, to explain aspects of the present invention.

It will be understood that although the terms "first", "second", etc. may be used herein to describe various components, these components should not be limited by these terms. These terms are only used to distinguish one component from another. As used herein, the singular forms "a" and "an" are intended to include the plural forms as well, unless the context clearly indicates otherwise. It will be further understood that the terms "includes," "including," "comprises," and/or "comprising" used herein specify the presence of stated features or components but do not preclude the presence or addition of one or more other features or components. It will be further understood that when an element or layer is referred to as being "on", "connected to", or "coupled to" another element or layer, it may be directly on, connected, or coupled to the other element or layer or one or more intervening elements or layers may also be present. When an element is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. Further, the use of "may" when describing embodiments of the present invention relates to "one or more embodiments of the present invention". Also, the term "exemplary" is intended to refer to an example or illustration.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

Sizes of elements in the drawings may be exaggerated for convenience of explanation. In other words, because sizes and thicknesses of components in the drawings may be arbitrarily illustrated for convenience of explanation, the following exemplary embodiments are not limited thereto. When a certain exemplary embodiment may be implemented differently, a specific process order may be performed differently from the described order. For example, two consecutively described processes may be performed substantially at the same time (e.g., concurrently) or performed in an order opposite to the described order.

As used herein, the term "and/or" includes any and all combinations of one or more of the associated listed items. Expressions, such as "at least one of," when preceding a list of elements, modify the entire list of elements and do not modify the individual elements of the list.

Figure 2:
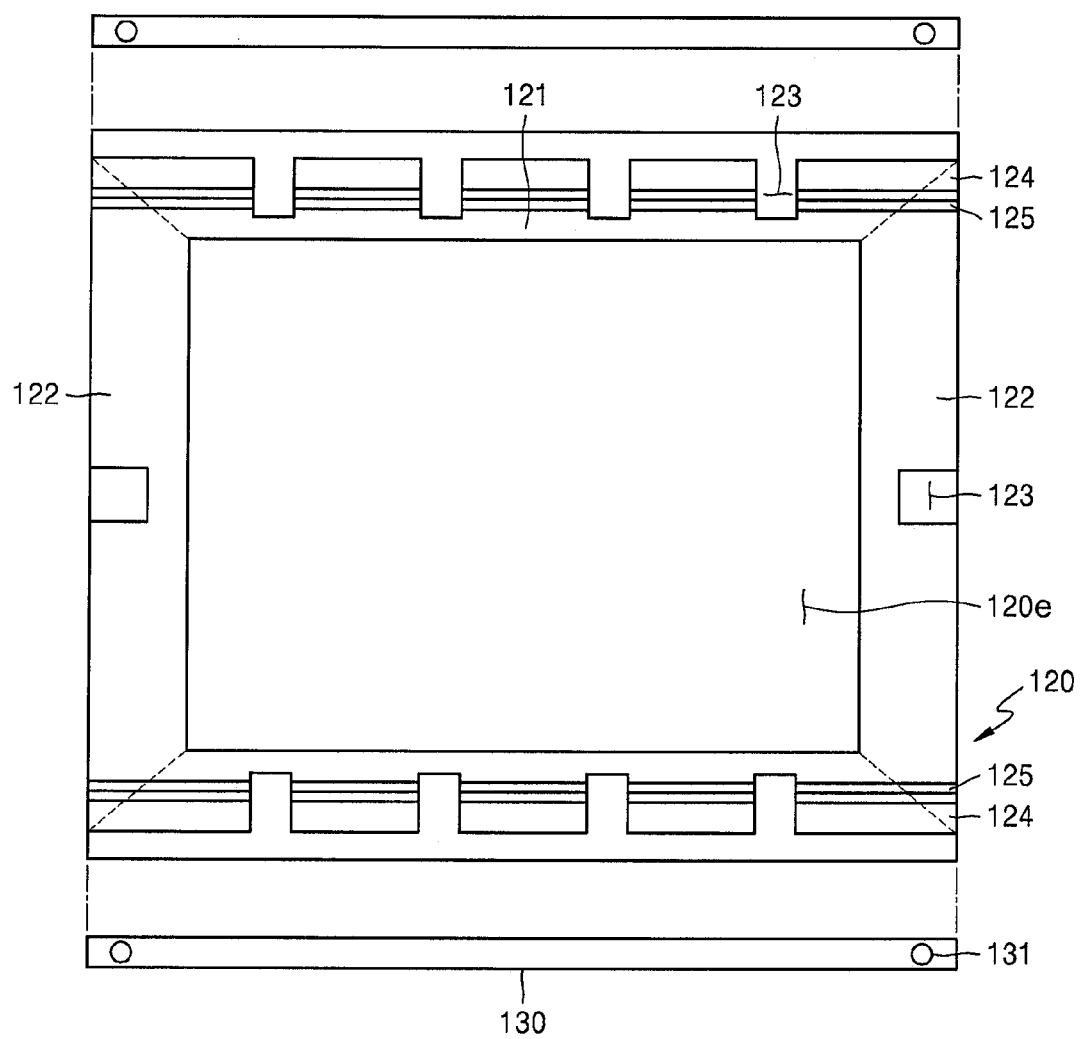
FIG. 2 is an exploded plan view illustrating a portion of the mask frame assembly illustrated in FIG. 1.
Figure 3:
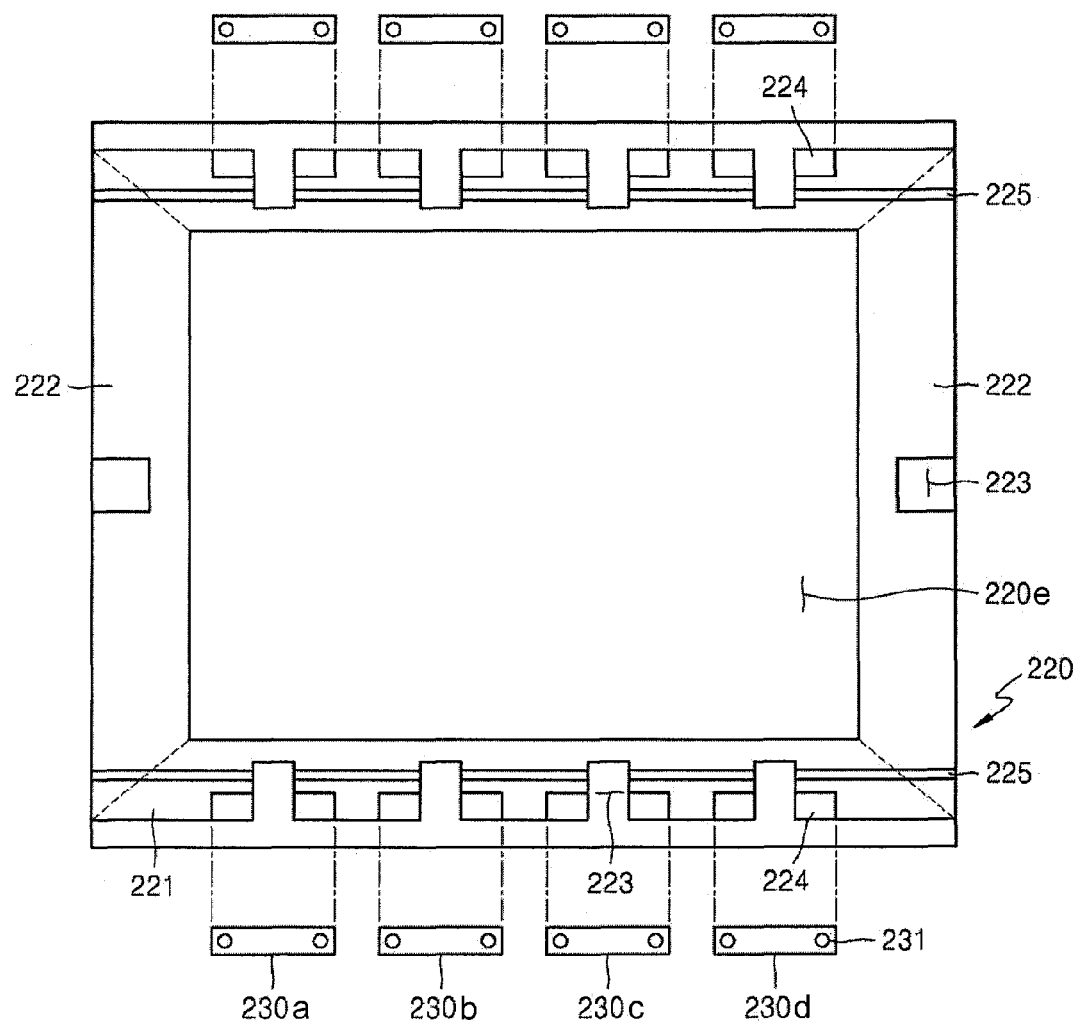
FIG. 3 is an exploded plan view illustrating a portion of a mask frame assembly according to another embodiment of the present invention.

FIG. 1 is an exploded perspective view schematically illustrating a mask frame assembly according to an embodiment of the present invention, FIG. 2 is an exploded plan view illustrating a portion of the mask frame assembly illustrated in FIG. 1, and FIG. 3 is an exploded plan view illustrating a portion of a mask frame assembly according to another embodiment of the present invention;

Referring to FIG. 1, the mask frame assembly 100 may include a mask 110, a frame 120, and a support stick 130.

A plurality of pattern openings 111 (e.g., pattern holes or slits) allowing a deposition material to pass therethrough may be formed in the mask 110. Pattern openings 111 may be formed as a plurality of dots; however, the present invention is not limited hereto. For example, the pattern openings 111 illustrated in FIG. 1 may be in any suitable numbers, sizes, arrangement, and/or have any suitable shapes. For example, pattern openings 111 may extend in one direction and be formed in a stripe shape (e.g., formed as a slit), and a plurality of pattern openings 111 may be arranged along a first direction of the mask 110, that is, the x-axis direction or a second direction thereof, that is, the y-axis direction.

The mask 110 may include at least one first welding opening 112 (e.g., first welding hole) formed to pass through at least one end of the mask 110, and when a plurality of first welding openings 112 are formed in the mask 110, they may be formed at opposite ends of the mask 110. The first welding opening 112 may be formed in a non-deposition area (NDA) of the mask 110, which is an area other than (e.g., outside) a deposition area (DA) defined by the plurality of pattern openings 111, and a first welding portion 140 connecting the mask 110 and the frame 120 together may be formed at the first welding opening 112 (e.g., the mask 110 may be welded to the frame 120 at the first welding opening 112).

The first welding portion 140 may be formed by laser melting a portion of the mask 110 when the first welding opening 112 is not formed in the mask 110; however, the present invention is not limited hereto. For example, as long as the first welding portion 140 connects the mask 110 and the frame 120 together, any kind of material or process may be used to form the first welding portion 140. For example, the first welding portion 140 may be formed by electroforming or electroless plating, after aligning the mask 110 with the first welding opening 112 formed therein and the frame 120. Methods of and cautions about electro-plating or electroless plating technologies are widely known and, thus, detailed descriptions thereof may be omitted.

The mask 110 may be manufactured as a partitioned mask in which a plurality partition masks (e.g., stick shaped partition masks), each having a plurality of pattern openings 111 are fixed to the frame 120, as illustrated in FIG. 1; however, the present invention is not limited hereto. For example, the mask 110 may be formed as a large member having a ledger shape (e.g., the mask 110 may be formed as a single large member having a plurality of pattern openings 111). For convenience of description, an embodiment in which the mask 110 is formed of a plurality of partitioned masks is primarily described below.

The frame 120 may be equipped with (e.g., may include) first support portions 121 arranged to face each other along the first direction, that is, the x-axis direction, and formed to support opposite ends of the mask 110, and second support portions 122, arranged to face each other along the second direction, that is, the y-axis direction which crosses (e.g., is traverse to) the first direction, that is, the x-axis direction. The second support portions 122 are each connected to an end of each of the first support portions 121.

The frame 120 may be manufactured with (e.g., may be formed of) metal, synthetic resin, etc., having rigidity to securely fix and support the mask 110 during the deposition process. In addition, the first support portions 121 and the second support portions 122 may form an opening 120e having a rectangular shape (e.g., a rectangular shaped opening) at the center of the frame 120; however, the present invention is not limited hereto. For example, the shape and/or size of the opening 120e may vary according to the deposition pattern of the deposition material or a shape of a display device. For example, the opening 120e may be formed having any suitable shape, such as a circle, an ellipse, or a polygon.

The first support portions 121 (e.g., one or more of the first support portions 121) may include a clamping slot 123 allowing the in-and-out movement of a clamper for carrying a substrate during the deposition process, a support slot 124 arranged to be adjacent to the clamping slot 123 and formed to have a depth (e.g., a predetermined depth or a depth less than a thickness of the first support portions 121), and a cutting slot 125 arranged more inside than the support slot 124 (e.g., arranged closer to opening 120e than the support slot 124 is) and formed to have a depth (e.g. a predetermined depth or a depth less than the thickness of the first supporting portions 121).

Prior to a further description of the clamping slot 123, a brief description of the movement of the substrate which is to be seated on and released from the mask frame assembly 100 during the deposition process will be given.

The deposition process is performed in a state in which the surface of the mask 110 is in contact with the substrate. The clamper may be provided to carry the substrate to the surface of the mask 110 and then seat and release the substrate on the surface of the mask 110. The clamper may be driven to move the substrate downward, in the direction of the surface of the mask 110, and fix edges of the substrate. Because the size of the substrate substantially corresponds to that of the opening 120e of the frame 120, the clamper may need to move to a position lower than that of the mask 110 in order to seat the substrate on the mask 110 (e.g., the clamper may need to move to be below an upper surface of the frame 120 to seat the substrate on the mask 110). Accordingly, when the clamping slot 123 is formed on the frame 120 as illustrated in FIG. 1, the clamper carrying the substrate may not touch the mask 110 and the frame 120 and, furthermore, may prevent damage to the mask 110 and the frame 120 when performing seating and releasing of the substrate on the mask 110.

The clamping slot 123 may be formed to pass through (e.g., to pass entirely through) the first support portion 121 as illustrated in FIG. 1; however, the present invention is not limited hereto. For example, the clamping slot 123 may be formed to have a depth (e.g., a predetermined depth or a depth less than the thickness of the first support portions 121) such that the clamper may not touch (e.g., contact) the mask 110 and the first support portion 121 even when the clamper reaches a position where the clamper may seat the substrate on the surface of the mask 110.

The support slot 124 may be formed to extend in the second direction, that is, the y-axis direction, and extend along the entire area (e.g., the entire length) of one of the first support portions 121 as illustrated in FIG. 2. In addition, in another embodiment as illustrated in FIG. 3, a modified support slot 224 may be formed to have portions that are separated from each other along the second direction and located at respective locations adjacent to the clamping slot 223.

When the support slot 124 having a shape as illustrated in FIG. 2 is formed on the support portions 121, the support stick 130, formed as a single (e.g., monolithic) part extending in the second direction, may be mounted on the support slot 124 to pass over (e.g., to cover) respective clamping slots 123.

At least one second welding opening 131 (e.g., second welding hole) passing through the support stick 130 at an end thereof may be formed, and when a plurality of second welding openings 131 are formed, they may be formed at both ends of the support stick 130. Referring to FIG. 2, the second welding opening 131 is illustrated to be located on a portion of the support stick 130 arranged over the second support portion 122; however, it is not limited hereto. The second welding opening 131 may be located on a portion of the support stick 130 arranged over the first support portion 121 or arranged over the boundary surface between the first support portion 121 and the second support portion 122. A second welding portion 150, combining the support stick 130 and at least one of the first support portions 121 and the second support portions 122, may be formed at the second welding opening 131.

The second welding portion 150, like the first welding portion 140 described above, may be formed by laser melting an end of the support stick 130 when the second welding opening 131 is not formed therein; however, the present invention is not limited hereto. For example, as long as the second welding portion 150 connects the support slot 124 and the support stick 130 together, any kind of material or structure may be used. For example, the second welding portion 150 may be formed by electro-forming or electroless plating, after aligning the support stick 130 having the second welding opening 131 with the support slot 124.

When the support slot 224 having a shape as illustrated in FIG. 3 (e.g., when the support slot 224 has a plurality of separate portions) is formed in the first support portions 221, a plurality of support sticks 230*a*, 230*b*, 230*c*, and 230*d* may be mounted on respective portions of the support slot 224 to be over the clamping slots 123.

At least one second welding opening 231 (e.g., second welding hole) passing through each of the support sticks 230*a*, 230*b*, 230*c*, and 230*d* may be formed on an end of the respective support sticks 230*a*, 230*b*, 230*c*, and 230*d*, and when a plurality of second welding openings 231 are formed in each of the support sticks 230*a*, 230*b*, 230*c*, and 230*d*, they may be at both ends of each of the respective support sticks 230*a*, 230*b*, 230*c*, and 230*d*. In addition, a second welding portion 250, combining (e.g., joining) a respective one of the support sticks 230 and at least one of the first support portions 221 and the second support portions 222 may be formed at the second welding openings 231. Because the second welding openings 231 and the second welding portion 250 are substantially identical to or identical to the first welding openings 131 and the first welding portion 140 described above in FIG. 2, a more detailed description thereof may be omitted. For convenience of description, an embodiment in which the support stick 130 is mounted on (e.g., over) the support slot 124, as illustrated in FIG. 2, is primarily described below.

The cutting slot 125 may be arranged more inside than the support slot 124 and formed to have a depth (e.g., a predetermined depth), and an edge portion of the mask 110 to be combined to the first support portion 121 may be provided more inside than the cutting slot 125. The process of removing a cutting portion 110*e* of the mask 110 is performed at the cutting slot 125, after combining the mask 110 and the frame 120 together in the process of manufacturing the mask frame assembly 100 (refer to FIG. 4), and a more detailed description of this process will be given later.

In addition, the support sticks 130, 230 and the second welding portions 150, 250 illustrated in FIGS. 2 and 3 may be removed from the support slots 124, 224 (e.g., the support sticks 130, 230 and the second welding portions 150, 250 may not be present) during the process of manufacturing the mask frame assembly 100. A more detailed description of this process will be given later with reference to FIGS. 4 through 8.

Figure 4:
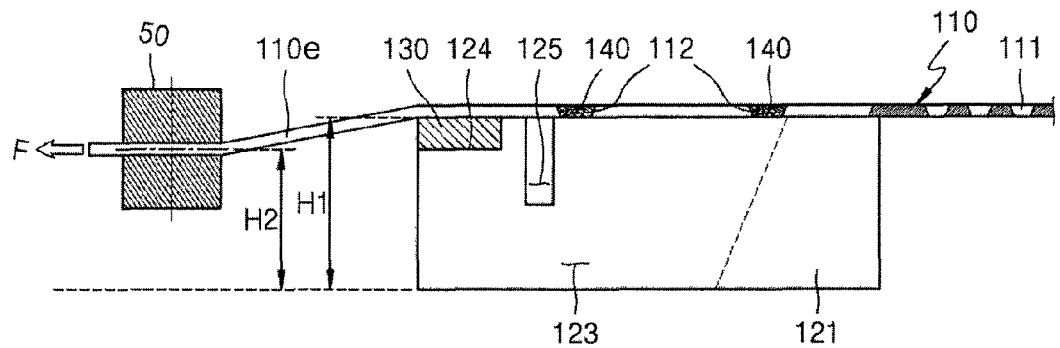
FIG. 4 is a cross-sectional diagram illustrating the mask being stretched by a stretcher during a process of manufacturing the mask frame assembly illustrated in FIG. 1.
Figure 5:
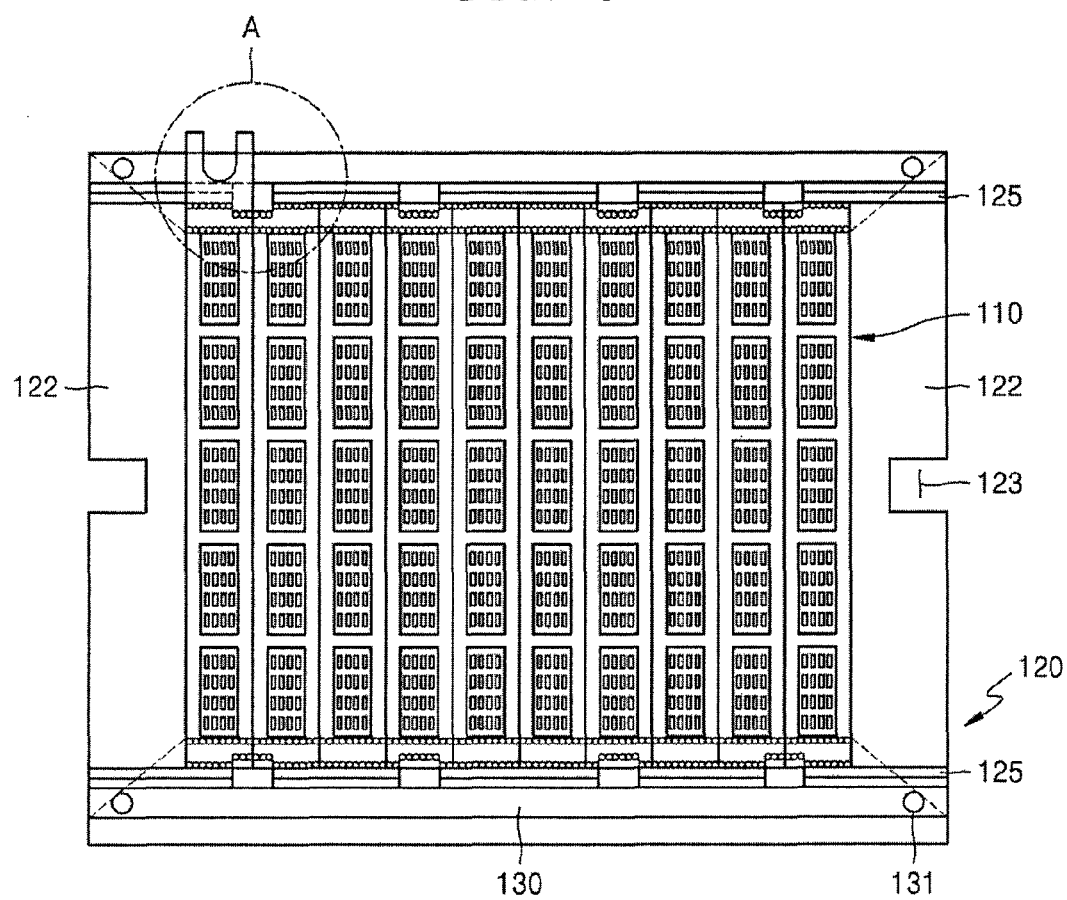
FIG. 5 is a plan view illustrating the mask with the cutting portion thereof partially removed during the process of manufacturing the mask frame assembly illustrated in FIG. 1.
Figure 6:
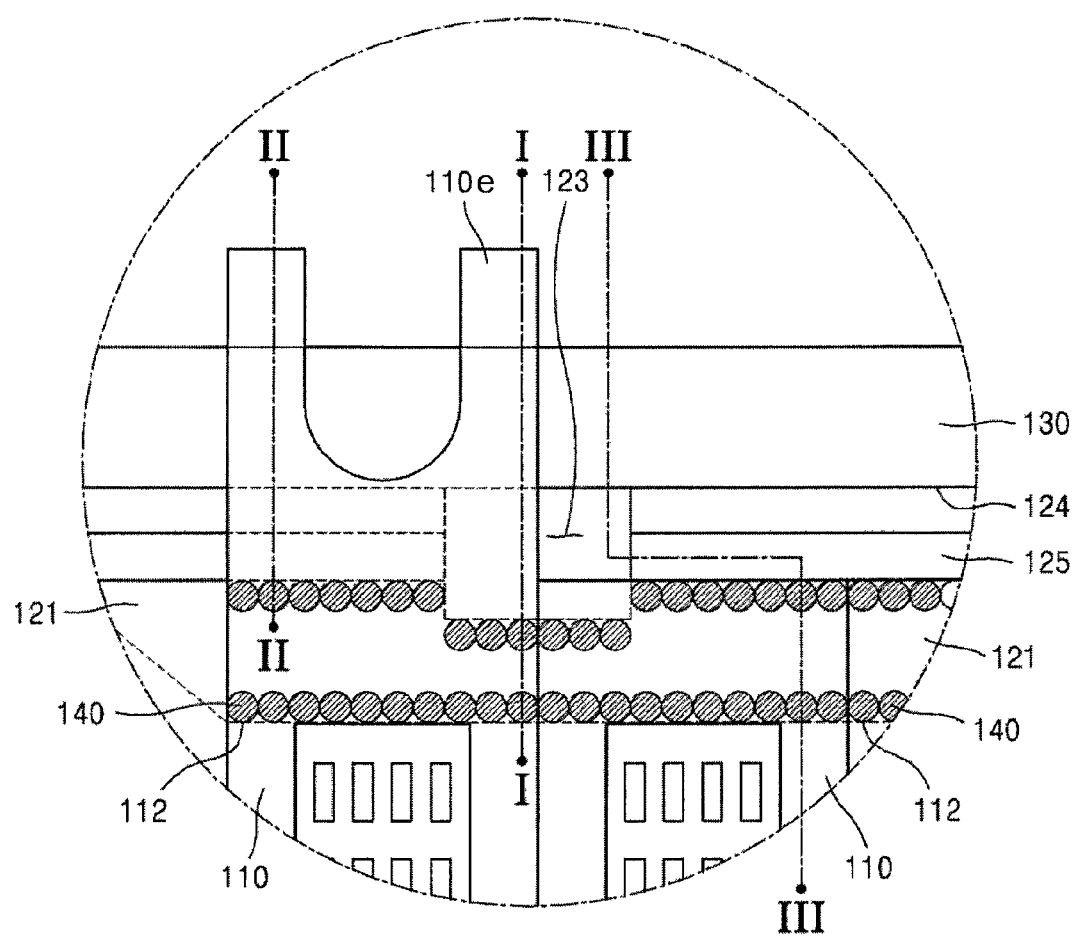
FIG. 6 is a partially enlarged view illustrating a close-up of the area A in FIG. 5.
Figure 7:
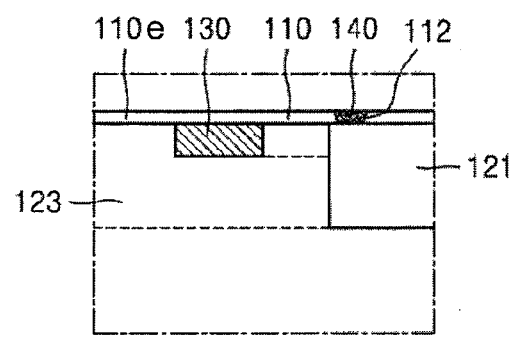
FIG. 7 is a cross-sectional view along the line I-I in FIG. 6.
Figure 8:
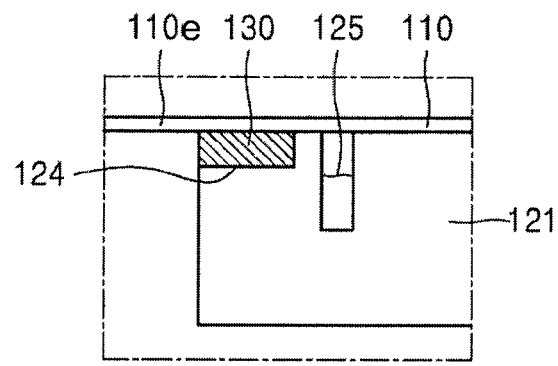
FIG. 8 is a cross-sectional view along the line II-II in FIG. 6.
Figure 9:
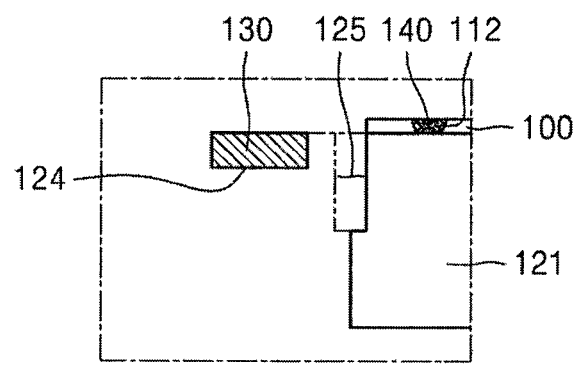
FIG. 9 is a cross-sectional view along the line III-III in FIG. 6.

FIG. 4 is a cross sectional view illustrating the mask being stretched by a stretcher during the process of manufacturing the mask frame assembly, FIG. 5 is a plan view illustrating the mask with the cutting portion thereof partially removed during the process of manufacturing the mask frame assembly illustrated in FIG. 1, FIG. 6 is a partially exploded view illustrating a close-up of the area A in FIG. 5, FIG. 7 is a cross sectional view along the line I-I in FIG. 6, FIG. 8 is a cross sectional view along the line II-II in FIG. 6, and FIG. 9 is a cross sectional view along the line III-III in FIG. 6.

Referring to FIG. 4, both ends of the mask 110 may be stretched F by a stretcher 50 and aligned with the first support portion 121 of the frame 120 before the mask 110 is combined with the frame 120. Both ends of the mask 110 may be positioned at (e.g., stretched to be at) a second height H2 which is lower than a first height H1 of the first support portion 121, and this positioning may enhance or increase the adhesion force between the mask 110 and the frame 120 during the welding process of the mask 110 and the frame 120.

However, because both ends of the mask 110 may be positioned at the second height H2, lower than the first height H1 of the frame 120, a portion of the mask 110 positioned on the clamping slot 123 may be curved down to a position lower than the first height H1 of the first support portion 121. When a portion of the mask 110 positioned on (or arranged over) the clamping slot 123 is curved down, that is, in the z-axis direction, a phenomenon may happen where the mask 110 may be minutely separated from the first support portion 121 during the welding process of the mask 110 and the first support portion 121.

When a portion of the mask 110 is minutely separated from the first support portion 121, a welding defect may occur at the first welding portion 140 formed at a position adjacent to the clamping slot 123 which may decrease the adherence between the mask 110 and the substrate during the deposition process using the mask frame assembly 100. Then, the deposition material may be deposited onto a non-desired zone of the substrate, that is, a dead zone, which may eventually lead to a defective display.

This phenomenon is referred to as a shadow effect. To manufacture a high-resolution display device, this shadow effect needs to be reduced as much as possible. According to one or more embodiments of the present invention, the mask frame assembly 100 may be equipped with the support stick 130 supporting a portion of the mask 110 which is not supported by the first support portion 121 due to the positioning of the portion of the mask on the clamping slot 123, which may enhance the adherence between the mask 110 and the frame 120 during the welding process of the mask 110 and the frame 120, thereby enhancing the alignment between the mask 110 and the substrate during the deposition process.

A more detailed description, with reference to FIGS. 5 through 9, is given for the process of manufacturing the mask frame assembly 100 according to one or more embodiments of the present invention.

A manufacturing method of the mask frame assembly 100 according to one or more embodiments of the present invention may include: preparing the mask 110 and the frame 120; installing the support stick 130 on the support slot 124; stretching both ends of the mask 110 in the first direction, that is, the x-axis direction and then, aligning a portion of both ends of the mask 110 on the support stick 130; combining the mask 110 and the frame 120; and removing the cutting portion 110e of the mask 110 located at an outer side of the support stick 130 (e.g., located outside of the support stick 130 with respect to the opening 120e).

FIG. 5 illustrates, in the manufacturing method of the mask frame assembly 100, a state where the mask 110 and the first support portion 121 are combined through the first welding portion 140 after the mask 110 is stretched F in the first direction by the stretcher 50 as illustrated in FIG. 4. The configuration and combination relation of the mask 110, the frame 120, the support stick 130, the first welding portion 140, and the second welding portion 150 are described in more detail with reference to FIGS. 1 through 4, and repeated description thereof may be merely outlined or omitted altogether.

Referring to FIGS. 5 through 8, the first welding portion 140 combining the mask 110 and the first support portion 121 may be located inside of the cutting slot 125 on the first support portion 121, that is, in a direction facing pattern openings 111 formed in the mask 110.

The figures illustrate that two first welding portions 140 are formed on respective ends of the mask 110; however, the present invention is not limited hereto. For example, numbers and/or arrangement positions of the first welding portions 140 may be suitably varied, as long as the mask 110 and the frame 120 are firmly fixed to each other at the first support portion 121. For example, first welding portions 140 may be formed at a position adjacent to pattern openings 111 and/or at a position adjacent to the cutting slot 125, thereby the entire surface of both ends of the mask 110 may closely adhere to the first support portion 121.

FIG. 7 illustrates an arrangement of a portion of the mask 110 on the clamping slot 123 and illustrates a configuration in which the support stick 130 mounted on the support slot 124 may support the mask 110 such that it does not curve down in the bottom surface direction of the first support portion 121. FIG. 8 illustrates another portion of the mask 110 supported by the first support portion 121 and indicates that the mask 110 may be supported by the support stick 130 as illustrated in FIG. 7.

When the plurality of support sticks 230a, 230b, 230c, and 230d, which are separated from each other (e.g., separated from each other by a predetermined spacing), are mounted at positions adjacent to clamping slots 223 as illustrated in FIG. 3, a portion of both ends of the mask 110 may not be supported by the support sticks 230. However, although a portion of both ends of the mask 110 may not be supported by the support stick 230 at the time of stretching of the mask 110, as illustrated in FIG. 4, both ends of the mask 110 may be stably supported by the first support portion 121 and thus, the downward curving of the mask 110 during the welding process of the mask 110 and the first support portion 121 may be reduced or prevented.

FIG. 9 illustrates a state in which the cutting portion 110e (refer to FIGS. 7 and 8) of the mask 110 is removed after the mask 110 is combined with the frame 120. The cutting boundary of the cutting portion 110e, that is, the outermost edges of the mask 110, may be arranged more inside than the outer surface of the cutting slot 125. Because the cutting process of the cutting portion 110e may be performed at the cutting slot 125, a generally utilized cutting method, such as a mechanical polishing process, a laser cutting process, and the like, may be applied as a removing method of the cutting portion 110e.

After the removing process of the cutting portion 110e is complete, the mask frame assembly 100 as illustrated in FIG. 1 may be manufactured. In addition, after the cutting portion 110e is removed, the support stick 130 may be removed from the support slot 124, and at this time, the second welding portion 150, connecting the support stick 130 and the support slot 124, may also be removed as described above.

Figure 10:
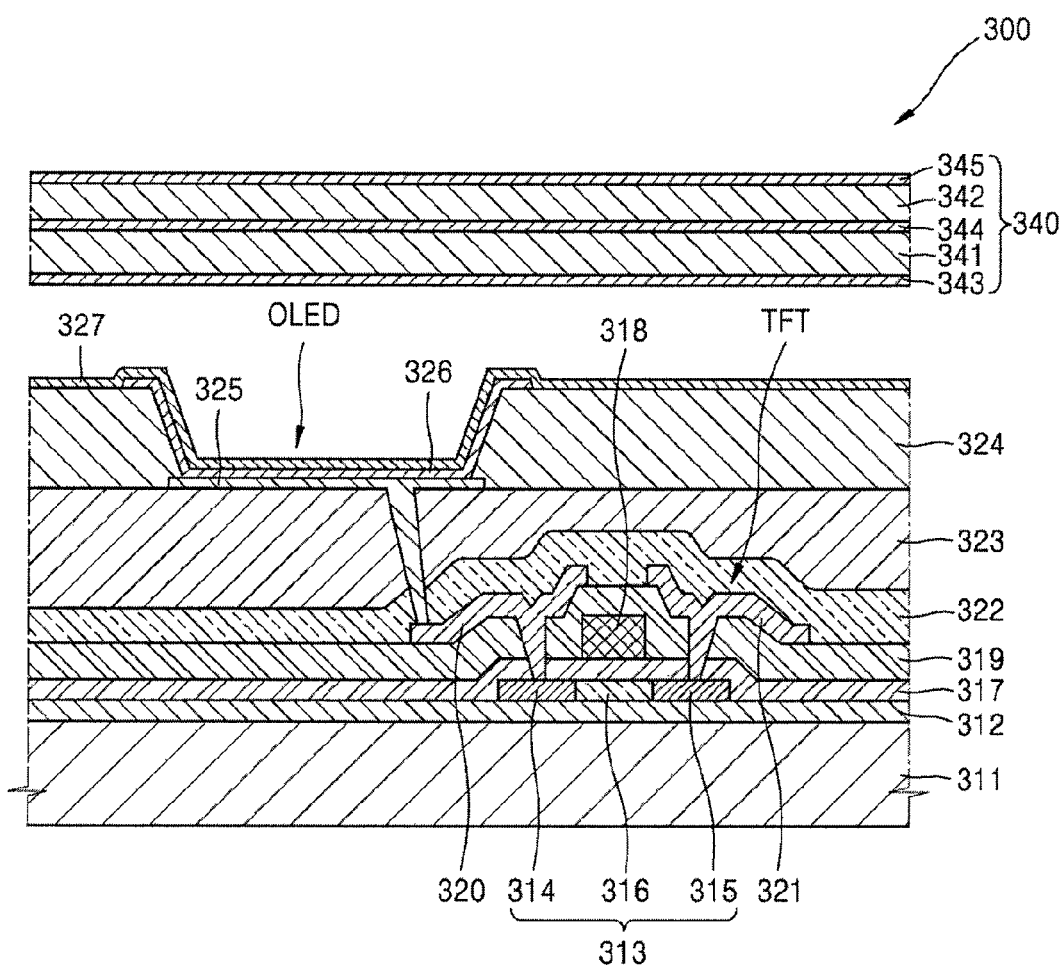
FIG. 10 is a diagram illustrating a display device manufactured using the mask frame assembly illustrated in FIG. 1.

FIG. 10 is a diagram illustrating the display device manufactured using the mask frame assembly illustrated in FIG. 1.

Referring to FIG. 10, a substrate 311 is included in the display device 300. The substrate 311 may include a flexible insulation material. For example, the substrate 311 may be a glass substrate. In addition, the substrate 311 may include a polymer material, such as polyimide (PI), polycarbonate (PC), polyethersulfone (PES), polyethylene terephthalate (PET), polyethylene naphthalate (PEN), polyarylate (PAR), fiber glass reinforced plastic (FRP), etc. The substrate 311 may be transparent, semi-transparent, or opaque.

A barrier layer 312 may be formed on the substrate 311. The barrier layer 312 may be formed to cover the entire upper surface of the substrate 311. The barrier layer 312 may include a non-organic layer and/or an organic layer. The barrier layer 312 may be formed as a single layer or as a laminate with multiple, stacked layers. For example, the barrier layer 312 may be formed of one or more inorganic materials, such as silicon oxide ($SiO_2$), silicon nitride ($Si_3N_4$), silicon oxynitride ($SiO_xN_y$), aluminum oxide ($Al_2O_3$), aluminum nitride (AlN), etc., and/or organic materials, such as acryl, polyimide, polyester, etc.

The barrier layer 312 may perform a role of reducing or preventing infiltration of oxygen and humidity, reducing or preventing diffusion of humidity or impurities through the substrate 311, and providing a planar surface at the upper portion of the substrate 311. A thin-film transistor (TFT) may be formed on the barrier layer 312. According to one or more embodiments of the present invention, the illustrated TFT is a top gate type TFT; however, a TFT having a different structure, such as a bottom gate type TFT, may be utilized.

A semiconductor activation layer 313 may be formed on the barrier layer 312. A source region 314 and a drain region 315 may be formed on the semiconductor activation layer 313 by doping impure ions of N type or P type. The region between the source region 314 and the drain region 315 may be a channel region 316 where impurities are not doped.

When the semiconductor activation layer 313 is formed of polysilicon, amorphous silicon may be formed and then changed to polysilicon by crystallization of amorphous silicon. In addition, the semiconductor activation layer 313 may be formed of an oxide semiconductor. For example, the oxide semiconductor may include oxides of metal elements from groups 4, 12, 13, and/or 14, such as zinc (Zn), indium (In), gallium (Ga), tin (Sn), cadmium (Cd), germanium (Ge) and/or hafnium (Hf), and materials selected from their combinations (e.g., alloys thereof).

A gate insulating layer 317 may be deposited on the semiconductor activation layer 313. The gate insulating layer 317 may include an inorganic layer, such as silicon oxide, silicon nitride, and/or metal oxide. The gate insulating layer 317 may have a structure of a single layer or stacked layers.

A gate electrode 318 may be formed in a region (e.g., a predetermined region) on the gate insulation layer 317. The gate electrode 318 may include a single layer of Au, Ag, Cu, Ni, Pt, Pd, Al, Mo, Cr, etc., or stacked layers of them or an alloy, such as Al:Nd and/or Mo:W.

An interlayer insulating layer 319 may be formed on the gate electrode 318. The interlayer insulating layer 319 may be formed of an insulating material, such as silicon oxide and/or silicon nitride. In addition, the interlayer insulating layer 319 may be formed of an insulating organic layer.

A source electrode 320 and a drain electrode 321 may be formed on the interlayer insulating layer 319. For example, contact openings (e.g., contact holes) may be formed by removing portions of the gate insulating layer 317 and the interlayer insulating layer 319, and through these contact openings, the source electrode 320 may be electrically connected to the source region 314 and the drain electrode 321 may be electrically connected to the drain region 315.

A passivation layer 322 may be formed on the source electrode 320 and the drain electrode 321. The passivation layer 322 may be formed of an inorganic layer, such as silicon oxide or silicon nitride, and/or an organic layer.

A planarization layer 323 may be formed on the passivation layer 322. The planarization layer 323 may include an organic layer of acryl, polyimide, benzocyclobutene (BCB), etc.

An organic light emitting diode (OLED) may be formed on the top portion of the TFT. The OLED may include a first electrode 325, a second electrode 327, and an intermediate layer 326 interposed between the first electrode 325 and the second electrode 327.

The first electrode 325 may be electrically connected to any one of the source electrode 320 and the drain electrode 321 through one of the contact openings. The first electrode 325 may correspond to a pixel electrode.

The first electrode 325 may function as an anode and be formed of various conducting materials. The first electrode 325 may be formed as a transparent electrode or a reflective electrode.

For example, when the first electrode 325 is a transparent electrode, the first electrode 325 may include ITO, IZO, ZnO, $In_2O_3$, etc. When the first electrode 325 is a reflective electrode, a reflective layer of the first electrode 325 may be formed of Ag, Mg, Al, Pt, Pd, Au, Ni, Nd, Ir, Cr, and/or compounds of these metals, and then, ITO, IZO, ZnO, and/or $In_2O_3$ may be formed on the top portion of the reflective layer.

A pixel define layer (PDL) 324 may be formed on the planarization layer 323 to cover edges of the first electrode 325 of the OLED. The pixel define layer 324 may define a light emitting region of respective sub-pixels by surrounding edges of the first electrode 325.

The pixel define layer 324 may be formed of an organic material and/or an inorganic material. For example, the pixel define layer 324 may be formed of an organic material, such as polyimide, polyamide, benzocyclobutene, an acryl resin, and/or a phenol resin, or an inorganic material, such as $Si_3N_4$. The pixel define layer 324 may be formed of a single layer or stacked layers.

An intermediate layer 326 may be formed on the first electrode 325 in an exposed region by etching a portion of the pixel define layer 324. The intermediate layer 326 may be formed by the deposition process.

The intermediate layer 326 may be formed of a low molecular weight organic material and/or a polymer organic material. The intermediate layer 326 may include an organic emissive layer (EML). As another selective example, the intermediate layer 326 may include the organic emission layer (EML) and additionally, one or more of a hole injection layer (HIL), a hole transport layer (HTL), an electron transport layer (ETL), and/or an electron injection layer (EIL). However, the present invention is not limited thereto. The intermediate layer 326 may include the organic emission layer and, additionally, other various functional layers.

The second electrode 327 may be formed on the intermediate layer 326. The second electrode 327 may correspond to a common electrode. The second electrode 327, like the first electrode 325, may be a transparent electrode or a reflective electrode.

When the first electrode 325 is a transparent electrode or a reflective electrode, the first electrode 325 may be formed having a shape corresponding to an opening of respective sub-pixels. In another embodiment, the second electrode 327 may be a transparent electrode or a reflective electrode on a display portion by a front deposition process. As an alternative, the second electrode 327 may be formed having a particular pattern instead of the front deposition process. The first electrode 325 and the second electrode 327 may be stacked at opposite locations as each other.

In one embodiment, the first electrode 325 and the second electrode 327 may be insulated from each other by the intermediate layer 326. When a voltage is applied to the first electrode 325 and the second electrode 327, visible light is emitted from the intermediate layer 326 and an image, which a user may recognize, may be realized.

An encapsulation layer 340 may be formed on the top portion of the organic light emitting diode (OLED). The encapsulation layer 340 may be formed to protect the intermediate layer 326 and other layers from humidity and/or oxygen from the outside.

The encapsulation layer 340 may have a structure in which an organic layer and an inorganic layer are stacked. For example, the encapsulation layer 340 may have a structure in which organic layers 341 and 342 including materials, such as epoxy, polyimide, polyethylene terephthalate, polycarbonate, polyethylene, and/or polyacrylate, and inorganic layers 343, 344, and 345 including materials, such as silicon oxide ($SiO_2$), silicon nitride ($Si_3N_4$), silicon oxynitride ($SiO_xN_y$), aluminum oxide ($Al_2O_3$), titanium oxide ($TiO_2$), zirconium oxide ($ZrO_2$), and/or zinc oxide (ZnO) are stacked.

The encapsulation layer 340 may have a structure in which at least one organic layer and at least two inorganic layers are stacked. The uppermost layer 345, exposed to the outside, of the encapsulation layer 340 may be formed of an inorganic layer to prevent infiltration of humidity into the OLED.

As described above, according to one or more exemplary embodiments of the present invention, a mask frame assembly, a manufacturing method of the same, and a manufacturing method of a display device may be realized with enhanced adherence between the mask and the frame during the manufacturing process; however, the scope of the present invention is not limited hereto.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments of the present invention have been described with reference to the figures, it will be understood by those of ordinary skill in the art that various changes in form and details may be made therein without departing from the spirit and scope as defined by the following claims and their equivalents.

What is claimed is:

1. A method of manufacturing a mask frame assembly, the method comprising:
arranging a mask on a frame, the mask having pattern openings, and the frame comprising:
a first support portion configured to support an end of the mask and having a clamping slot, a cutting slot, and a support slot, the clamping slot being configured to allow in and out movement of a clamper, the support slot being adjacent to the clamping slot, and the cutting slot being arranged nearer to a center of the mask frame assembly than the support slot is; and
a second support portion connected to the first support portion;
mounting a support stick on the support slot and over the clamping slot, the support stick extending along a second direction;
stretching an end of the mask in a first direction crossing the second direction and aligning a portion of the end of the mask to be on the support stick;
joining the mask and the frame to each other; and
removing a cutting portion of the mask.

2. The method of manufacturing the mask frame assembly of claim 1, further comprising preparing the mask by forming a first welding opening extending through an end of the mask.

3. The method of manufacturing the mask frame assembly of claim 2, wherein the joining the mask and the frame comprises forming a first welding portion at the first welding opening to join the mask and the frame to each other.

4. The method of manufacturing the mask frame assembly of claim 1, wherein the clamping slot has a depth that is less than a thickness of the first support portion.

5. The method of manufacturing the mask frame assembly of claim 1, wherein the clamping slot extends through the first support portion.

6. The method of manufacturing the mask frame assembly of claim 1, wherein the support slot extends along the second direction.

7. The method of manufacturing the mask frame assembly of claim 1, wherein the mounting the support stick on the support slot comprises forming a second welding opening that extends through an end of the support stick and forming a second welding portion at the second welding opening to join the support stick and the frame to each other.

8. The method of manufacturing the mask frame assembly of claim 1, further comprising preparing the frame, the preparing the frame comprising forming the cutting slot on the first support portion, the cutting slot having a depth that is less than a thickness of the first support portion, and both the ends of the mask being arranged nearer to the center of the mask frame assembly than an outside surface of the cutting slot after the cutting portion of the mask is removed.

9. A method of manufacturing a display device, the display device comprising a first electrode and a second electrode oppositely facing each other on a substrate and an organic layer between the first electrode and the second electrode, wherein the organic layer and the second electrode are deposited on the substrate by using a mask frame assembly, the mask frame assembly comprising:
a mask having pattern openings; and
a frame, the frame comprising:
a first support portion configured to support an end of the mask and having a clamping slot, a cutting slot, and a support slot adjacent to the clamping slot, the cutting slot being nearer to a center of the frame than the support slot is; and
a second support portion connected to the first support portion.

10. A method of manufacturing a mask frame assembly, the method comprising:
arranging a mask on a frame, the mask having pattern openings, and the frame comprising:
a first support portion configured to support an end of the mask and having a clamping slot, a cutting slot, and a support slot, the clamping slot being configured to allow in and out movement of a clamper, the support slot being adjacent to the clamping slot, and the cutting slot being arranged nearer to a center of the mask frame assembly than the support slot is; and
a second support portion connected to the first support portion;
mounting a support stick on the support slot and over the clamping slot, the support stick extending along a second direction;
stretching an end of the mask in a first direction crossing the second direction and aligning a portion of the end of the mask to be on the support stick;
joining the mask and the frame to each other; and
removing a cutting portion of the mask,
wherein the removing of the cutting portion of the mask is performed at the cutting slot.

* * * * *